US006563734B2

(12) United States Patent
Taki

(10) Patent No.: US 6,563,734 B2
(45) Date of Patent: May 13, 2003

(54) NON-VOLATILE SEMICONDUCTOR MEMORY DEVICE CAPABLE OF EXECUTING ERASABLE, WRITABLE AND READABLE FUNCTIONS SIMULTANEOUSLY

(75) Inventor: Masamitsu Taki, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/931,109

(22) Filed: Aug. 17, 2001

(65) Prior Publication Data
US 2002/0024088 A1 Feb. 28, 2002

(30) Foreign Application Priority Data
Aug. 30, 2000 (JP) ........................................ 2000-261187

(51) Int. Cl.[7] .............................................. G11C 16/04
(52) U.S. Cl. .............................. 365/185.11; 365/185.28
(58) Field of Search ....................... 365/185.11, 185.28, 365/185.29, 185.12, 185.05

(56) References Cited

U.S. PATENT DOCUMENTS 5,708,603 A * 1/1998 Tanaka .................. 365/185.21
5,812,460 A * 9/1998 Kobatake ............... 365/185.11
6,222,779 B1 * 4/2001 Saito et al. ............. 365/189.09

FOREIGN PATENT DOCUMENTS

JP 7-281952 10/1995

* cited by examiner

Primary Examiner—Michael S. Lebentritt
Assistant Examiner—Anh Phung
(74) Attorney, Agent, or Firm—Morrison & Foerster LLP

(57) ABSTRACT

In the non-volatile semiconductor memory device of the present invention, its memory region comprises a number of erasable, writable and readable memory blocks in which these functions can be carried out simultaneously. According to the present non-volatile semiconductor memory device, since the memory region is controlled by a partition unit constituting a plurality of memory blocks, the number of objects to be controlled can be reduced relative to the case where the memory region is controlled as individual memory block units.

Thus, in a system using the present non-volatile semiconductor memory device, the control thereof can be simplified than in a conventional system.

11 Claims, 8 Drawing Sheets

NON-VOLATILE SEMICONDUCTOR MEMORY DEVICE CAPABLE OF EXECUTING ERASABLE, WRITABLE AND READABLE FUNCTIONS SIMULTANEOUSLY

FIELD OF THE INVENTION

The present invention relates to a non-volatile semiconductor memory device having electrically erasable, writable and readable functions. More particularly, the present invention relates to a non-volatile semiconductor memory device capable of executing these functions at the same time.

BACKGROUND OF THE INVENTION

In electrically batch-erasable, writable, and readable non-volatile semiconductor memory devices, erase and write operations require several hundred- to several hundred thousand-folds operation time relative to a read operation. Therefore, a single non-volatile semiconductor memory device can carry out neither a write operation nor a read operation during an erase operation and, can carry out neither an erase operation nor a read operation during a write operation.

Accordingly, in order to carry out erase, write and read operations simultaneously, a system such as electrical products need to have multiple non-volatile semiconductor memory devices so that while an erase or write operation is carried out with one non-volatile semiconductor memory device, a read operation with another non-volatile semiconductor memory device.

JP-A 7/281952 discloses a method of carrying out simultaneously two or more functions of erase, write, and read operations. A method using a latch circuit is described in FIG. 7 as a Conventional Example 1, and a method using a selector circuit in FIG. 8 as a Conventional Example 2. The prior art disclosed in JP-A 7/281952 will be illustrated hereinafter by referring to FIGS. 7 and 8.

FIG. 7 shows a block diagram representing a constitution of the Conventional Example 1. A non-volatile semiconductor memory device (IC) 1 comprises a control signal 2 entered from outside, data 3, address 4, and a power supply 5. A command analyzing and status data generating part 6 analyzes a command entered as data 3, and controls the whole of IC 1.

The IC 1 further comprises an erase control part 7 and a write control part 8. The erase control part 7 transmits a status signal 7a to communicate that the erase control part 7 is busy to the command analyzing and status data generating part 6, a request signal 7b which is transmitted to the command analyzing and status data generating part 6 before the erase control part 7 uses a bus 9 (9a~9h, 9i), and an acknowledge signal 7c to communicate that the bus 9 (9a~9h, 9i) is able to be used to the erase control part 7 when the command analyzing and status data generating part 6 obtains the request signal 7b. The write control part 8 transmits a status signal 8a to communicate that the write control part 8 is busy to the command analyzing and status data generating part 6, a request signal 8b which is transmitted to the command analyzing and status data generating part 6 before the write control part 8 uses a bus 9 (9a~9h, 9j), and an acknowledge signal 8c to communicate that the bus 9 (9a~9h, 9j) is able to be used to the erase control part 7 when the command analyzing and status data generating part 6 obtains the request signal 8b.

The bus 9 (9a~9h) transmits an address signal, a data signal, and a control signal from the command analyzing and status data generating part 6, the bus 9i connects the bus 9 to the erase control part 7, and the bus 9j connects the bus 9 to the write control part 8. Memory blocks 10a~10h are composed of a row decoder, a column decoder, a sense amplifier and a memory array cell. Latch circuits 11a~11h temporarily memorize each of an address signal, a data signal and a control signal from the buses 9a~9h and transmit these signals to the memory blocks 10a~10h. The data once latched are never altered except when they are altered by controlling by the command analyzing and status data generating part 6. Buses 12a~12h connect the latch circuits 11a~11h.

In FIG. 8, buses 14 (14a~14h) are for erasing, and transmit each of an address signal, a data signal and a control signal from the erase control part 7 to the memory blocks 10a~10h, and buses 15 (15a~15h) are for writing, and transmit each of an address signal, data signal and control signal from the write control part 8 to the memory blocks 10a~10h. Selector circuits 13a~13h select one of signals from bus 14 for erasing, bus 15 for writing and bus 9, to transmit the selected signal to the memory blocks 10a~10h.

Next, operations will be explained below.

First, a read operation is explained.

When a read signal consisting of a control signal 2 and an address 4 is entered into the command analyzing and status data generating part 6 from the outside, the command analyzing and status data generating part 6 confirms whether a memory block from which data are to be read is busy on an erase operation or a write operation. If the memory block from which data are to be read is busy, then, a status of error is returned to the outside via the data 3. If the memory block from which data are to be read is not busy, then, a read signal is transmitted through the bus 9, the latch circuit 11, and the bus 12 to the memory block 10 to read data from a memory cell in the memory block.

Subsequently, the data to be read are sent from the memory block 10 through the bus 12, the latch circuit 11, and the bus 9 to the command analyzing and status data generating part 6 and, then, the read operation is completed when the data which have been read are sent to the outside through the data 3. Additionally, whether the memory block is busy or not is confirmed by transmitting a read signal to the latch circuits 11a~11h, and by thereupon returning a busy signal indicating on operation from the latch circuit 11 to the command analyzing and status data generating part 6.

Second, a write operation is explained.

When a write signal consisting of the control signal 2 and an address signal 4, and data to be written and entered through data 3 are entered into the command analyzing and status data generating part 6 from the outside, the command analyzing and status data generating part 6 transmits an operation starting signal to the write control part 8 through the bus 9j after having confirmed that the memory block to which data is to be written is not in erasing (on operating) (i.e., after having confirmed that a busy signal indicating on an operation is not returned from the latch circuit 11, but a read signal indicating on-waiting for a subsequent operation is returned). Then, the write control part 8 makes a status signal 8b indicating on a write operation active.

The write control part 8 sends a request for using the bus 9 by a request signal 8b to the command analyzing and status data generating part 6, and when it receives the permission for use of the bus 9 as an acknowledge signal 8c, it transmits a write signal and data to be written through the bus 9, the latch circuit 11 and the bus 12 to the memory block 10, at this point in time, a write operation starts.

In order to write data, it is needed to keep applying a voltage required to write data to the memory cell for a certain period of time and, this voltage is also applied via the common bus 9. Therefore, arbitration of using the bus 9 is required. Specifically, since a write operation spends a relatively long time, a read operation is restricted when the write operation is carried out. Consequently, the effect of simultaneous operation is reduced. Therefore, time sharing of the write operation is performed to permit a read operation between the periods of the write operation.

In order to interrupt the write operation once, the state of the bus 9 is saved in the latch circuit 11 and, the operation state of the memory block to which data is written is maintained. After that, the request signal is made to be non-active to open the bus 9 to the command analyzing part and status data generating part 6. In order to resume the write operation after a certain period has elapsed, the request signal 8b is made to be active so that the write control part 8 can send again a request for using the bus 9, and thereafter it waits the return of the acknowledge signal 8c from the command analyzing and status data generating part 6. The period during which the write control part 8 releases the bus 9 is controlled using an inner timer. When the write operation has completed by repeating these operations, the write operation is quitted and, then, in a similar way, the use of the bus 9 is requested to enter a write verifying operation. If the verification result is normal (OK), then, the completion of the write operation is sent to the command analyzing and status data generating part 6 via the status signal 8a, and the write control part 8 quits the operation, the write operation is completed. If the verification result is abnormal (NG), then, the memory cell is made to be in the write status again to carry out the write verifying. These operations are repeated a predetermined times to return a status of write error from the command analyzing and status data generating part 6 to the outside via data 3.

Third, an erase operation is explained.

Basically, a procedure of the erase operation is the same as that of the write operation, except for the voltage applied to the memory cell and the applying time thereof (in the current mass production, the time for an erase operation is longer than that for a write operation by three places). That is, when an erase signal consisting of a control signal 2, a data 3 and an address 4, and erase data are sent to the command analyzing and status data generating part 6 from the outside, after the command analyzing and status data generating part 6 confirms that the memory block in which data are to be erased is not in writing (on operation), it transmits an operation starting signal to the erase control part 7 via the bus 9i. Then, the erase control part 7 makes a status signal 7a indicating on an erase operation active. The erase control part 7 sends a request for using the bus 9 by a request signal 7b to the command analyzing and status data generating part 6, and when it receives the permission for use of the bus 9 as an acknowledge signal 7c, it transmits an erase signal through the bus 9, the latch circuit 11, and the bus 12 to the memory block 10, at this point in time, an erase operation starts. In order to erase data, since it is needed to keep applying a voltage required to erase data to the memory cell for a certain period of time, the function of the latch circuit 11 makes the memory block 10 to be in a holding state, temporarily stops the use of the bus 9, and makes the request signal 7b non-active to communicate the evacuation of the bus 9 to the command analyzing and status data generating part 6.

After a certain period of time as measured with an inner timer, the erase control part 7 makes again the request signal 7b active and, then, the erase control part 7 waits the return of the acknowledge signal 7b from the command analyzing and status data generating part 6. When the permission for the use of the bus 9 returns as the acknowledge signal 7c, the erase control part 7 occupies the bus 9, in order to make the memory cell carry out an erase verifying operation, it transmits a signal through the bus 9, the latch circuit 11 and the bus 12 to the memory block 10, and stops the erase operation to enter the erase verifying operation. If the verifying result is normal (OK), then, the completion of the erase operation is sent to the command analyzing and status data generating part 6 via the status signal 7a, and the erase control part 7 quits the operation, the erase operation is completed. If the verify result is abnormal (NG), then, the memory cell is made to be in the erase state again to carry out the erase verifying. These operations are repeated a predetermined times to return a status of write error from the command analyzing and status data generating part 6 to the outside via data 3.

The erase, write and read operations are carried out in this way and, thus, for example, while the erase operation is carried out in the memory block 10a and the write operation is carried out in the memory block 10b, the read operation can be carried out in the memory block 10c. Naturally, when the read operation is carried out continuously, since interruptions of the request signal 7b and the acknowledge signal 7c sometimes occur between the read operations, the access time is partially extended. In general, this merely means that waits occur during the memory access, a busy time is long, or the return of the acknowledge signal delays. Therefore, the system can be used without problems in operations.

FIG. 8 shows a block diagram presenting the constitution of the Conventional Example 2.

First, a read operation is explained.

When a write signal consisting of a control signal 2 and an address 4 is entered into the command analyzing and status data generating part 6 from the outside, the part 6 confirms whether a memory block from which data is to be read is on an erase operation or a write operation. If the memory block from which data are to be read is busy, then, a status of error is returned to the outside via data 3. If the memory block from which data are to be read is not busy, then, a read signal is transmitted through a bus 9, a selector circuit 13 and a bus 12 to the memory block 10 to read data from a memory cell in the memory block. Subsequently, the data to be read are sent from the memory block 10 through the bus 12, the selector circuit 13 and the bus 9 to the command analyzing and status data generating part 6 and, then, the read operation is completed when the data to be read are sent to the outside through the data 3.

Additionally, whether a memory block is busy or not is confirmed by transmitting a read signal to the selector circuit 13, and by thereupon returning a busy signal indicating on the erase or write operation from the selector circuit 13 to the command analyzing and status data generating part 6 when the selector circuit 13 selects the bus 14 or the bus 15.

Second, a write operation is explained.

When a write signal consisting of the control signal 2 and an address 4, and data to be written and entered through data 3 are entered into the command analyzing and status data generating part 6 from the outside, the command analyzing and status data generating part 6 transmits an operation start signal to the write control part 8 through the bus 9j after having confirmed that the memory block to which data is to be written is not in erasing (on operating) (i.e., after having confirmed that a busy signal indicating on operation is not returned from the selector circuit 13, but a read signal indicating on waiting for a subsequent operation is returned).

Then, the write control part 8 makes a status signal indicating on a write operation active. The write control part 8 transmits a write signal and a write data through the selector circuit 13 and the bus 12 to the memory block 10 via the bus 15 for a write operation and, then, the write operation starts. After applying a voltage required to write to the memory cell for a certain period of time, verifying is carried out. If the verify result is normal (OK), then, the write operation is completed, the write control 8 makes the status signal 8*b* non-active, and sends the completion of the write operation to the command analyzing and status data generating part 6. If the verify result is abnormal (NG), then, it reenters the write and verifying operations. These operations are repeated predetermined times, when the verifying result is abnormal (NG), a status of write error is sent from the command analyzing and status data generating part 6 to the outside via data 3. Additionally, when a voltage is applied to the memory cell for a certain period of time, the applying time is controlled using an inner timer in the write control part 8.

This conventional Example 2 is characterized in that, for example, since it has a bus 15 for writing and, consequently, it is not needed to arbitrate the use of a single bus 9 by using the request signal 8*b* and the acknowledge signal 8*c*, the write control 8 controls the whole process from the start to the completion for writing during the write operation, so that the selector circuit 13 and the memory block 10 can be occupied. Thus, since the write operation is not affected by other than the circuits of the write control part 8, the selector circuit 13 and the memory block 10, the operation speed is high.

Third, an erase operation is explained.

Basically, a procedure of the erase operation is the same as that of the write operation. That is, when an erase signal consisting of a control signal 2, data 3 and an address 4, and an erase data are sent to the command analyzing and status data generating part 6 from the outside, after the command analyzing and status data generating part 6 confirms that the memory block in which data are erased is not in writing (on operation) (i.e., after having confirmed that a busy signal indicating on operation is not returned from the selector circuit 13, but a read signal indicating on waiting for a subsequent operation is returned), it transmits an operation starting signal to the erase control part 7 via the bus 9*i*.

Then, the erase control part 7 makes a status signal 7*a* indicating on an erase operation active. The erase control part 7 transmits a signal to the selector circuit 13, the bus 12 and the memory block 10 via the bus 14 for erasing, at this point in time, an erase operation starts. After applying a voltage required to erase to the memory cell for a certain period of time, verifying is carried out. If the verify result is normal (OK), then, the erase operation is completed, and the erase control 7 makes the status signal 7*b* non-active, and sends the completion of the erase operation to the command analyzing and status data generating part 6.

If the verify result is abnormal (NG), then, it reenters the write and verifying operations. These operations are repeated predetermined times, when the verify result is abnormal (NG), a status of write error is sent from the command analyzing and status data generating part 6 to the outside via data 3.

Since the control of the erase, write and read operations are, in this way, carried out, respectively, via independent buses 14, 15 and 9 and, then, for example, while the erase operation is carried out in the write control part 8, the buses 15 and 15*a* for writing, the selector circuit 13*a*, the bus 12*a* and the memory block 10*a*, and the erase operation is carried out in the erase control part 7, the buses 14 and 14*b* for erasing, the selector circuit 13*b*, the bus 12*b* and the memory block 10*b*, the read operation can be carried out in the command analyzing and status data generating part 6, the buses 9 and 9*c*, the selector circuit 13*c*, the bus 12*c* and the memory block 10*c*.

The market of an electrically-rewritable non-volatile semiconductor memory device represented by, for example, a flash memory increases mainly in the field of portable phones and, further, multi-functionalization and high-functionalization rapidly progress. Therefore, the specifications demanded for the non-volatile semiconductor memory devices are being diversified, it becomes difficult to meet the demand in the market with a fixed specification determined at the stage of the circuit designing as conventional.

However, in the non-volatile semiconductor memory devices described above, a selector circuit and a latch circuit correspond to memory blocks one to one, a single selector circuit controls a single memory block so that the memory region controlled by the single selector circuit is fixed at the stage of the circuit designing and, then, it can not be altered. That is, in the single non-volatile semiconductor memory device, a size of the memory region is fixed where two or more functions from erasing, writing and reading can be carried out at the same time, and the size is never altered except when the device is re-designed.

Thus, the present invention has been made to flexibly satisfy the diversifying market demand, and an object of the present invention is to provide a non-volatile semiconductor memory device which can alter the memory size according to the demanded specification where two or more functions can be carried out at the same time, and which can further alter the memory size dynamically.

SUMMARY OF THE INVENTION

In order to solve the above problem, the present inventors have introduced a novel concept, termed "partition", and have developed a non-volatile semiconductor memory device which can carry out erasing, writing and reading at the same time by a partition unit.

The partition according to the present invention includes a plurality of memory blocks, wherein the number of the memory blocks contained in one partition may be altered with a command control from the outside.

The non-volatile semiconductor memory device of the present invention has a plurality of erasable, writable and readable memory segments, and can carry out erase, write and read functions simultaneously by altering a combination of these memory segments. Thus, distribution of memory segments to be used can be effectively performed according to the purpose of using by altering the memory segments where these functions can be carried out at the same time. That is, the present invention provides a non-volatile semiconductor memory device which can flexibly satisfy the diversifying market demand. In addition, since the alteration of the memory region distribution is possible by entering a command, the distribution of memory segments to be used can be effectively preformed anytime according to the purpose of use.

A non-volatile semiconductor memory device of the present invention (claim 1) has a memory region comprised of a plurality of memory segments which are electrically batch-erasable, writable, and readable, each of the plurality of memory segments being independently operable from each other, said non-volatile semiconductor memory device comprising a memory-region-division-information holding-mean which holds a memory region division information for dividing the memory region into a plurality of memory segment groups comprising at least one memory segment, and a memory-segment-group selecting-mean which generates a signal for selecting a memory segment group to all the memory segments belonging to the each of the memory segment groups according to the held memory-region-division-information holding-mean.

That is, a constitution of a memory segment group comprising one or more memory groups (hereinafter, referred to as "partition") is determined by memory region division information which is held by a memory-region-division-information holding-mean, and selection of memory segments constituting one partition is carried out by a memory-segment-group selecting-mean.

The non-volatile semiconductor memory device of the present invention (claim 2) is characterized in that the memory region division information held in the memory-region-division-information holding-mean is fed by entering a command from the outside.

That is, the constitution of the partition can be altered by entering a command.

The non-volatile semiconductor memory device of the present invention (claim 3) is characterized in that the memory segment group for which the memory-segment-group selecting-mean generates a selecting signal is directed by entering an address from the outside.

That is, a partition to be accessed is selected arbitrarily by entering an address from the outside.

The non-volatile semiconductor memory device of the present invention (claim 4) is characterized in that the memory segment comprises a memory block, a latch circuit holding an operation state of the memory block, and a selector circuit selecting any of signals required to erase, write and read, and transmitting the selected signal to the memory block.

The non-volatile semiconductor memory device of the present invention (claim 5) is characterized in that the selector circuit selecting any of the signals required to erase, write and read is controlled by the selecting signal from the memory-segment-group selecting-mean or an operation state of the memory block which is held in the latch circuit.

That is, the memory segment constituting a partition comprises a memory block, a latch circuit and a selector circuit. When an operation is carried out to the partition, since a signal corresponding to the operation is selected and, subsequently, the status of the operation is memorized, during the operation of in this partition, another operation can be carried our in another partition.

The non-volatile semiconductor memory device of the present invention (claim 6) is characterized in that a circuit holding information in the memory-region-division-information holding-mean comprises a non-volatile memory.

That is, once the constitution of the partition has been set up, the information is held after the power is shut down.

The non-volatile semiconductor memory device of the present invention (claim 7) is characterized in that a circuit holding information in the memory-region-division-information holding-mean comprises a volatile memory.

That is, by using a volatile memory, a write speed is enhanced, and a temporary, dynamic alteration of the partition constitution can be carried out even while the circuit is used.

The non-volatile semiconductor memory device of the present invention (claim 8) is characterized in that a circuit holding information in the memory-region-division-information holding-mean comprises both a non-volatile memory and a volatile memory.

That is, after the power is turned on, a partition constitution can be temporarily and dynamically altered from the preset initial state.

The non-volatile semiconductor memory device of the present invention (claim 9) is characterized in that the memory-region-division-information holding-mean has a protection-information holding-mean which holds information for protecting the memory region division information and, further, a mean for prohibiting alteration of the memory region division information according to the held protection information.

That is, it is possible to prevent the partition constitution from being undesirably altered with entry of an incorrect command by setting the protection information.

The non-volatile semiconductor memory device of the present invention (claim 10) is characterized in that information for protecting the memory region division information is given to the protection-information holding-mean by entering a command from the outside.

That is, since the protection information itself is set by entering a command, it is possible to set or cancel the protection as needed.

The non-volatile semiconductor memory device of the present invention (claim 11) is characterized in that it further comprises a mean for invalidating the command entry into the protection-information holding-mean.

That is, it is possible to disapprove in future the alteration of the partition constitution once set by prohibiting setting of the protection information.

DETAILED DESCRIPTION OF THE INVENTION

Although the Examples of the present invention are hereinafter explained in detail with referring to FIGS. 1–6, the present invention is never limited to the Examples described below.

EXAMPLE

Figure 1:
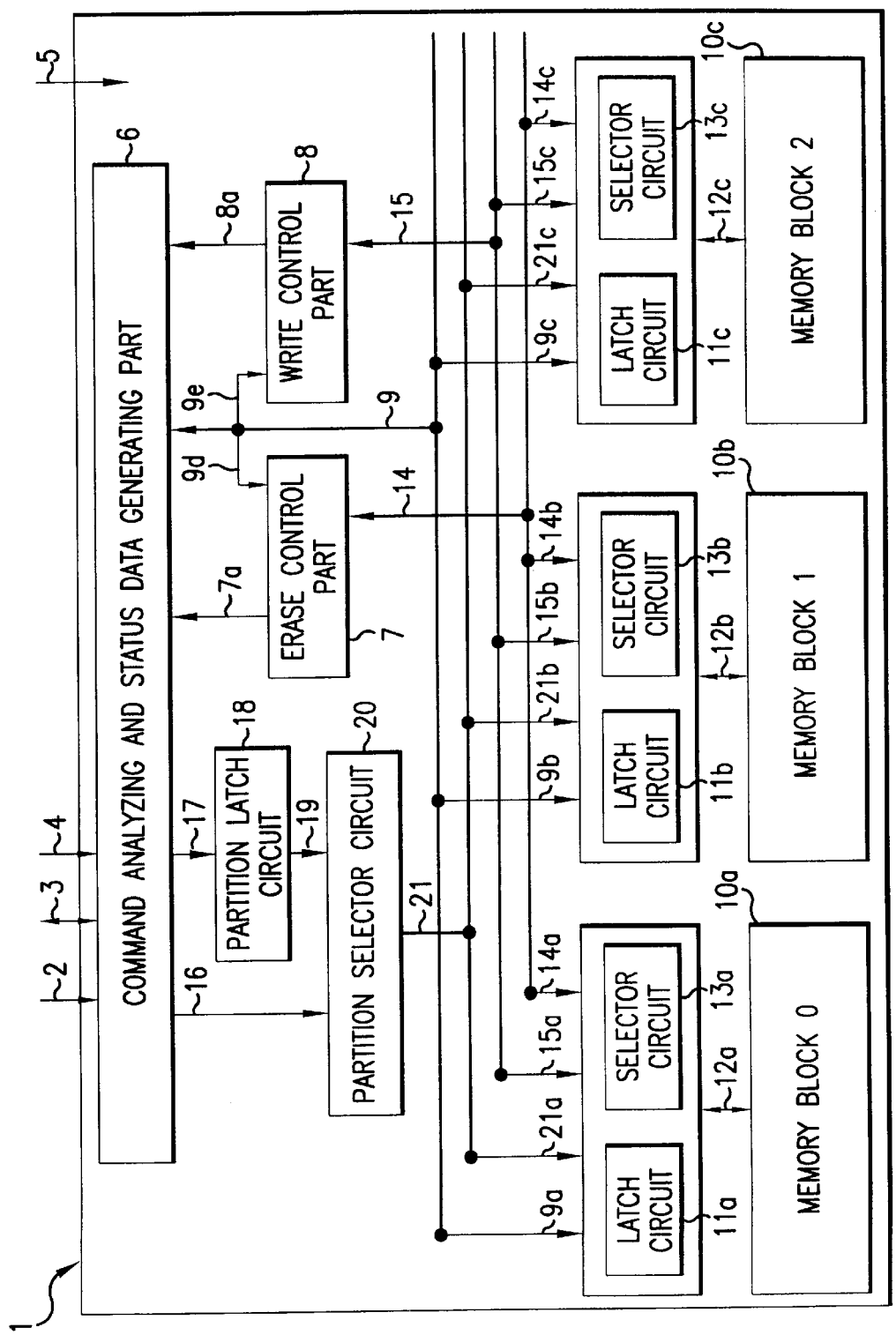
FIG. 1 is a block diagram showing a non-volatile semiconductor memory device of the present invention.

Constitution of the Non-Volatile Semiconductor Memory Device in Accordance With the Present Invention FIG. 1 shows a block diagram representing the Example of the present invention.

A non-volatile semiconductor memory device (IC) 1 comprises a control signal 2 to be entered from the outside, data 3, an address 4, and a power supply 5. A command analyzing and status data generating part 6 analyzes a command entered as data 3, and controls the whole of IC 1.

The IC 1 further comprises an erase control part 7 and a write control part 8. A status signal 7a communicates that the erase control part 7 is busy to the command analyzing and status data generating part 6. A status signal 8a communicates that the write control part 8 is busy to the command analyzing and status data generating part 6.

A bus 9 transmits an address signal, a data signal, a control signal and a start request signal for an erase or write operation from the command analyzing and status data generating part 6, data to be read and a memory block status signal from the memory block. A bus 9d connects the bus 9 to the erase control part 7, and a bus 9e connects the bus 9 to the write control part 8.

Memory blocks 10a~10c are composed of a row decoder, a column decoder, a sense amplifier and a memory array cell.

Latch circuits 11a~11c temporarily memorize a memory block status sent via the buses 12a~12c from the memory blocks 10a~10c which are selected by a partition selecting information sent via a bus 21 described below.

The buses 12a~12c connect the memory blocks 10a~10c, the latch circuits 11a~11c, and selector circuits 13a~13c.

The selector circuits 13a~13c transmit any of signals form the bus 9, a bus 14 for erasing, or a bus 15 for writing to the memory blocks 10a~10c which are selected by a partition selecting information sent via the bus 21 described below.

The bus 14 is for erasing, and transmits each of an address signal, a data signal and a control signal from the erase control part 7 to the memory blocks 10a~10c.

The bus 15 is for writing, and transmit each of an address signal, data signal and control signal from the write control part 8 to the memory blocks 10a~10c.

An address bus 16 directs a memory block in which data are erased, written or read.

A partition latch circuit 18 holds information indicating to which partition each of the memory blocks belongs (hereinafter, referred to as "partition division information").

The bus 17 is a bus for writing the partition division information to the partition latch circuit 18 when the control signal 2, the data 3, and the address 4 received by the command analyzing and status data generating part 6 are a command to write to the partition latch circuit 18.

A bus 19 outputs the partition division information held in the partition latch circuit 18.

A partition selector circuit 20 selects a partition including one memory block directed by the address bus 16 from the address bus 16 and the partition division information bus 19 to make all the memory blocks included in the partition to be in a selected state.

A bus 21 is outputted from the partition selector circuit 20, and sends the partition selection information indicating all the memory blocks in the selected state included in one partition.

A Method for Selecting Memory Blocks, as Well as Erase and Write Controls

First, a method for selecting memory blocks in a partition at writing, erasing and reading is explained.

The command analyzing and status data generating part 6 receives a control signal 2, data 3 and an address 4 from the outside, and analyzes a function to be carried out and a memory block to be selected. The analyzed information is sent to the erase control part 7 or the write control part 8 via the bus 9. The erase control part 7 or the write control part 8 transmits an erase signal or a write signal to the selector circuits 13a~13c via the bus 14 or the bus 15 according to the analyzed information.

The partition latch circuit 18 holds the partition division information sent from the command analyzing and status data generating part 6 via the bus 17.

The partition selector circuit 20 sends a partition selection information which is a signal to select all the memory blocks in the partition to which the selected memory block belongs according to the address information sent from the command analyzing and status data generating part 6 via the bus 16 to select one memory block and the partition division information sent from the partition latch circuit 18 via the bus 19, to the selector circuits 13a~13c via the bus 21.

1. A Method for Selecting a Memory Block

Figure 2:
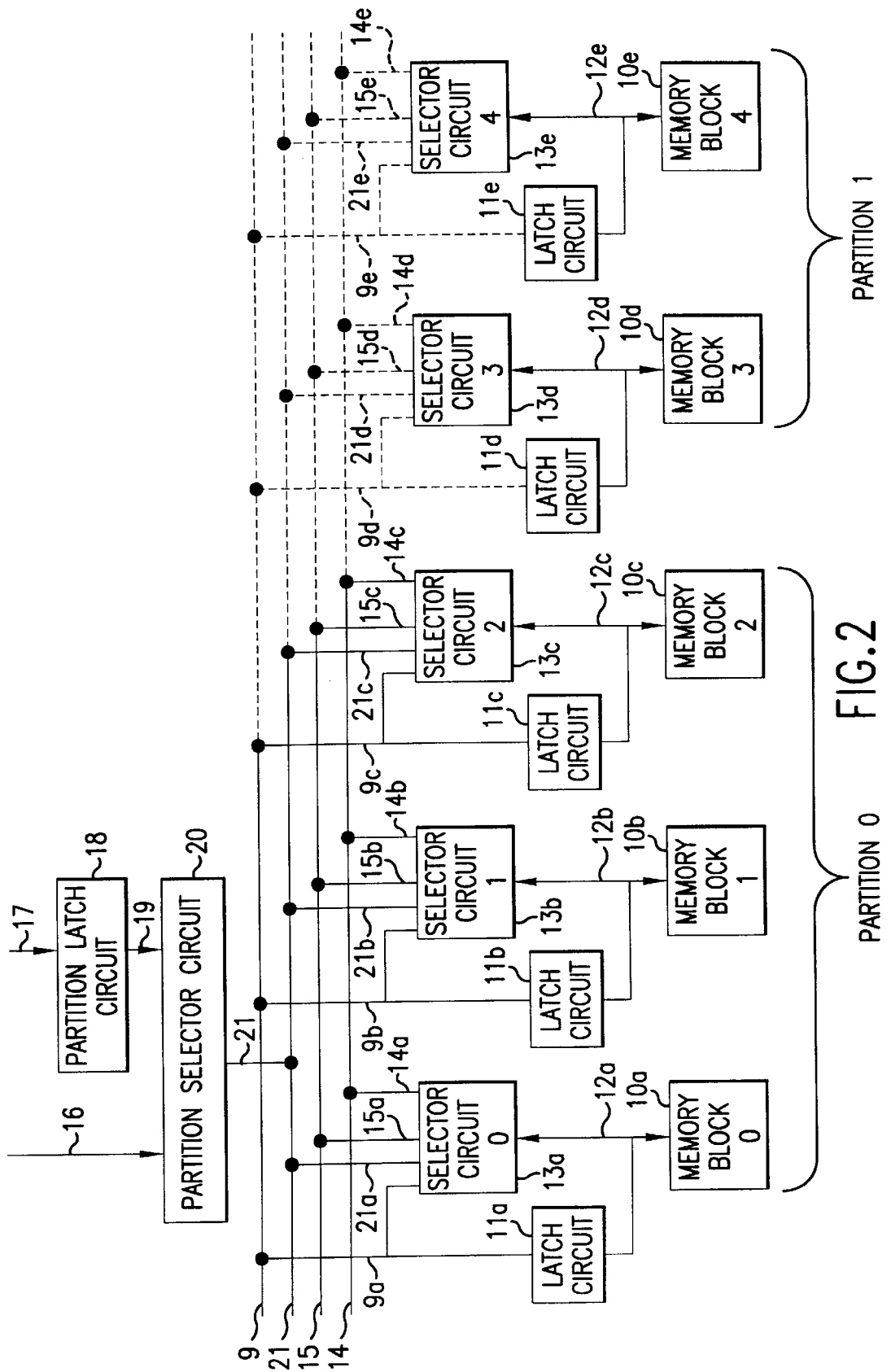
FIG. 2 is a block diagram showing a non-volatile semiconductor memory device of the present invention.

An embodiment of the method for selecting all the memory blocks included in a partition is explained using FIG. 2.

A partition comprises a plurality of sets, each set being composed of a memory block, and a latch circuit and a selector circuit connected to the memory block.

FIG. 2 shows a case where two partition are set. Specifically, memory blocks 0, 1 and 2 constitute a Partition 0, and memory blocks 3 and 4 constitute a Partition 1.

In FIG. 2, since the constituents indicated with the same symbols as those in FIG. 1 are the same as or equivalent to the constituents in FIG. 1, only different constituents from FIG. 1 are described below.

Memory blocks 10a~10e are composed of a row decoder, a column decoder, a sense amplifier and a memory array cell (not shown).

Buses 12a~12e connect the memory blocks 10a~10e to latch circuits 11a~11e, and selector circuits 13a~13e.

The selector circuits 13a~13e transmit any of signals form the bus 9, a bus 14 for erasing, or a bus 15 for writing to all of the memory blocks (here, 10a~10c) which are selected by a partition selecting information sent via the bus 21.

The bus 14 is for erasing, and transmits each of an address signal and a control signal to be transmitted to the memory blocks 10a~10e from the erase control part 7.

First, if the control signal 2, the data 3 and the address 4 are a command to write to the partition latch circuit 18, the command analyzing and status data generating part 6 writes them to the partition latch circuit 18 as partition division information. The partition division information set in the partition latch circuit 18 is further sent to the partition selector circuit 20 via the bus 19.

Below, such a case is considered where the partition division information thus sent to the partition selector circuit 20 instructs to constitute one partition with memory blocks 0, 1 and 2 (i.e., 10a~10c) and latch circuits 11a~11c and selector circuits 13a~13c which are connected to them, to constitute another partition with memory blocks 3 and 4 (i.e., 10d and 10e) and latch circuits 11d~11e and selector circuits 13d~13e which are connected to them, and the address information sent via the bus 16 to select one memory block directs the memory block 1.

As described above, a partition comprises a plurality of sets, each set being composed of a memory block, and a latch circuit and a selector circuit connected to the memory block, but hereinafter, a partition constitution is represented by a memory block included therein for simplicity.

The partition selector circuit 20 judges that the memory block 1 constitutes a partition together with the memory blocks 0 and 2 from the partition division information entered, to send a partition selection information instructing to make the memory blocks 0 and 1 which are included in the same partition including the memory block 1 to be in the selected state via the bus 21.

Similarly, when the address information sent via the bus 16 to select one memory block directs to the memory block 3, the partition selector circuit 20 judges that the memory block 3 constitutes a partition together with the memory block 4 from the partition division information entered, to send a partition selection information instructing to make the memory block 4 which is included in the same partition including the memory block 3 to be in the selected state via the bus 21.

In this way, based on a first memory block in which data are erased, written or read, all the memory blocks included in the same partition which includes the first memory block can be selected by a command (data), an address, a control signal, to make the whole partition to be in the selected state.

2. Erase and Write Control

Next, an erase operation and a write operation are explained in memory blocks included in the above selected partition.

In FIG. 1, the command analyzing and status data generating part 6 receives a control signal 2, data 3 and an address 4 from the outside, and analyzes a function to be carried out and a memory block in which the function is carried out. The analyzed information is sent to the erase control part 7 or the write control part 8 via the bus 9*d* or 9*e* depending on whether the function to be carried out is erasing or writing.

Herein, such a case is considered where the Partition 0 consisting of memory blocks 0, 1 and 2 (i.e., 10*a*~10*c*) is selected by the partition selection information.

The selector circuits 13*a*~13*c* select either an erase or write operation start request signal generated by the command analyzing and status data generating part 6, and transmits the selected operation start request signal to all the memory blocks included in the partition selected by the partition selection information sent via the buses 12*a*~12*c* from the partition selector circuit 20 via the bus 21.

When all the memory blocks included in the partition selected by the partition selection information sent from the partition selector circuit 20 via the bus 21 receive an erase or write operation start request signal, they send memory block status information indicating on the erase or write operation to the latch circuits 11*a*~11*c* via the buses 12*a*~12*c*.

The latch circuits 11*a*~11*c* hold the memory block status information sent via the buses 12*a*~12*c*. The held information is sent to the command analyzing and status data generating part 6 and the selector circuits 13*a*~13*c* via the bus 9 (9*a*~9*c*), the command analyzing and status data generating part 6 recognizes that the erase control part 7 or the write control part 8 is on an operation, and the selector circuits 13*a*~13*c* select either the erase or write control signal transmitted from the erase control part 7 or the write control part 8 based on the memory block status information indicating on the held erase or write operation, to send it to the memory block via the bus 12 (12~12*c*). This process is continued until the erase or write operation is completed.

A Method for Carrying Out Erasing, Writing and Reading Simultaneously

Figure 3:
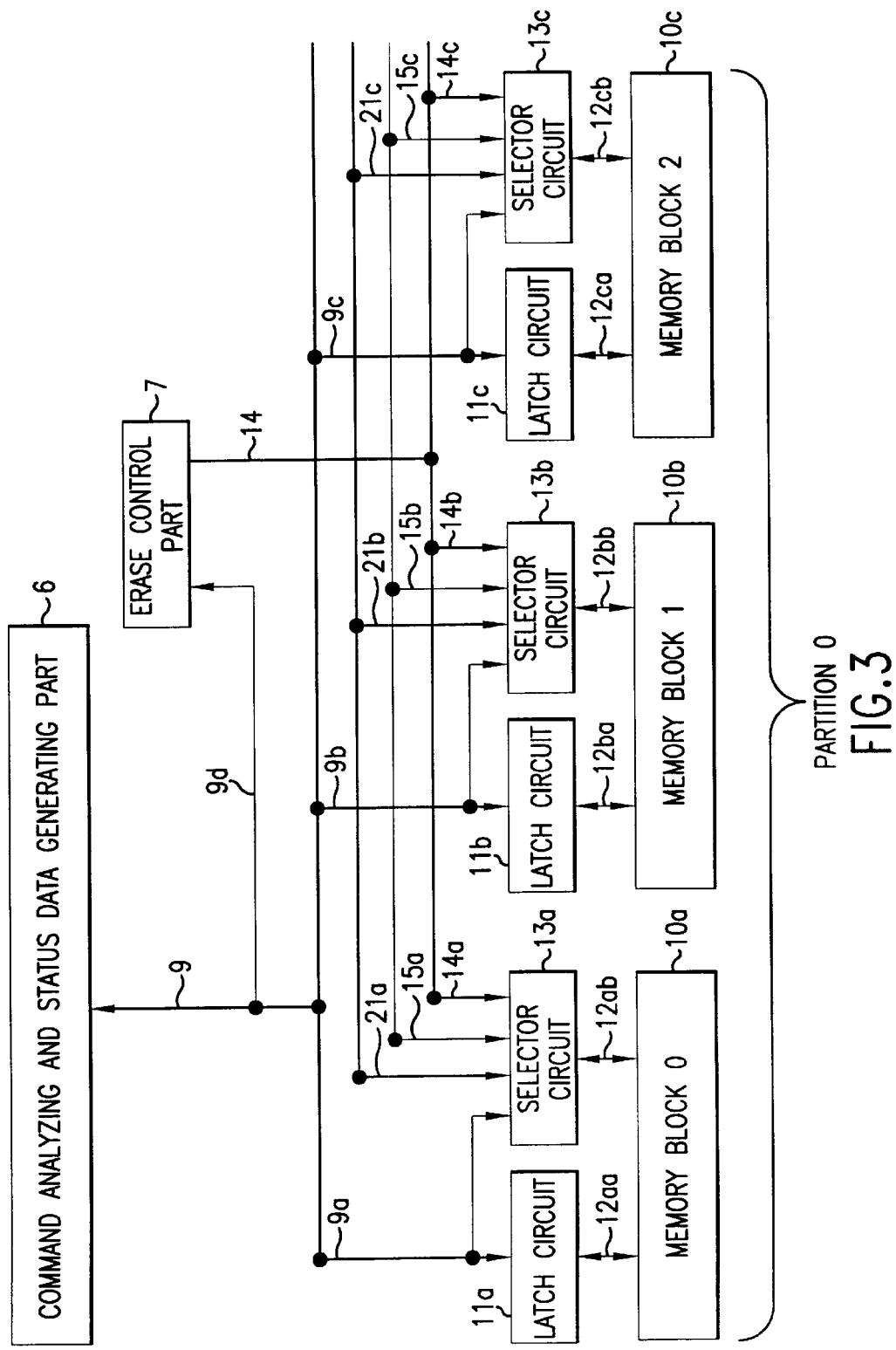
FIG. 3 is a block diagram showing an embodiment of the present invention, which comprises a partition 0 comprised of memory blocks 0, 1 and 2.

Next, using FIG. 3, an embodiment of a method is explained for carrying out at the same time an erase, write or read operation independently by a partition.

FIG. 3 describes in detail the Partition 0 consisting of the memory blocks 0, 1 and 2. In FIG. 3, since the constituents indicated with the same symbols as those in FIG. 1 are the same as or equivalent to the constituents in FIG. 1, only different constituents from FIG. 1 are described below.

Buses 12*aa*, 12*ba* and 12*ca* connect the latch circuits 11*a*~11*c* and the memory blocks 10*a*~10*c*, respectively. Buses 12*ab*, 12*bb* and 12*cb* connect the selector circuits 13*a*~13*c* and the memory blocks 10*a*~10*c*, respectively.

As explained in FIG. 2, when the control signal 2, the data 3 and the address 4 are a command for writing to a partition latch circuit 18, the command analyzing and status data generating part 6 writes them to the partition latch circuit 18 as partition division information.

Below, such a case is considered that memory blocks 0, 1 and 2 constitute one partition (partition 0) according to the partition division information, and the memory blocks 0, 1 and 2 constituting the partition 0 are in the selected state according the partition selection information sent via the bus 21 (21*a*~21*c*).

The command analyzing and status data generating part 6 receives the control signal 2, the data 3 and the address 4 from the outside, and analyzes a function to be carried out and a memory block in which the function is carried out.

1. Erase and Write Operations

The case where the function to be carried out is an erase operation is explained.

First, an erase operation start request signal is transmitted to the selector circuits 13*a*~13*c* via the buses 9*a*~9*c*. Since the memory blocks 0, 1 and 2 constituting the partition 0 are selected according to the partition selection information sent via the bus 21 (21*a*~21*c*), the selector circuits 13*a*~13*c* receive the erase operation start request signal, and transmit the signal to the memory blocks 10*a*~10*c* via the buses 12*ab*, 12*bb* and 12*cb*.

When the memory blocks 10*a*~10*c* have received the erase operation start request signal, they start the erase operation, and send memory block status information indicating on an erase operation to the latch circuits 11*a*~11*c* via the buses 12*aa*, 12*ba* and 12*ca*.

The latch circuits 11*a*~11*c* hold the memory block status information indicating on the erase operation, which has been sent via the buses 12*aa*, 12*ba* and 12*ca*. The saved memory block status information indicating on the erase operation is sent to the command analyzing and status data generating part 6 and the selector circuits 13*a*~13*c* via the bus 9 (9*a*~9*c*).

Then, the command analyzing and status data generating part 6 recognizes that the erase control part 7 is on operation, and the selector circuits 13*a*~13*c* select the erase control signal transmitted from the erase control part 7 according to the held memory block status information indicating on the erase operation, to transmit the signal to the memory blocks 10*a*~10*c* via the buses 12*a*~12*c*. This process is continued until the erase operation is completed.

At the end of the erase operation, the latch circuits 11*a*~11*c* hold memory block status information indicating the completion of the erase operation, which is sent from the memory blocks 10*a*~10*c* via the buses 12*aa*, 12*ba* and 12*ca*.

The held memory block status information indicating the completion of the erase operation is sent to the command analyzing and status data generating part 6 and the selector circuits 13*a*~13*c* via the bus 9. Then, the command analyzing and status data generating part 6 recognizes that the erase control part 7 is not on an operation, and the selector circuits 13*a*~13*c* finish the transmission, to the memory blocks 10*a*~10*c*, of the erase control signal transmitted from the erase control part 7 according to the held information indicating the completion of the erase operation.

That is, at the beginning of the erase operation, the memory blocks 10a~10c are selected according to the partition selection information sent via the bus 21 (21a~21c), while during the erase operation, they are selected according to the memory block status information indicating on the erase operation, which is held in the latch circuits 11a~11c. Therefore, during an erase operation, only the erase control part 7 and the selector circuits 13a~13c, and the memory blocks 10a~10c and the latch circuits 11a~11c can carry out the erase operation via the bus 14 for erasing and the bus 12. They are independently operable from other memory blocks, selector circuits, latch circuits and the write control part 8.

Writing operations are similar to the series of the internal operations described above.

Thus, as in the above embodiments, a non-volatile semiconductor memory device of the present invention associates partitions with an erase control part 7 or a write control part 8 one by one allowing an erase operation of a write operation to be carried out every partition.

Additionally, although a single erase control part 7 and a single write control part 8 are shown in FIG. 1, the present non-volatile semiconductor memory device can have a plurality of partitions on an erase operation or a write operation by providing with a plurality of erase control parts and write control parts.

2. A Read Operation

A read operation is explained.

In a read operation, the command analyzing and status data generating part 6 transmits a read request signal via the bus 9 to partitions which are associated with neither the erase control part 7 nor the write control part 8, that is, on neither an erase operation nor a write operation. If the latch circuits 11a~11c have no memory status information indicating on erase and write operations, since the selector circuits 13a~13c do not send memory block status information to the bus 9, the selector circuits 13a~13c select the bus 9 to transmit a read request signal transmitted via the bus 9 to the memory blocks 10a~10c via the bus 12a~12c. The memory blocks 10a~10c send read data to the selector circuits 13a~13c via the buses 12ab, 12bb and 12cb, the selector circuits 13a~13c select the bus 9 to send the read data to the command analyzing and status data generating part 6 via the bus 9, and the command analyzing and status data generating part 6 outputs the read data to the outside via the data 3.

In this way, erase and write operations are independently carried out by holding information indicating on an erase or write operation in the latch circuits 11a~11c every partition, and by associating the erase control part 7 or the write control part 8, respectively, with every partition via each independent bus 14 for erasing or bus 15 for writing. In addition, partitions in which an erase or write operation are not carried out is readable via the bus 9 under the control of the command analyzing and status data generating part 6. Therefore, since the erase, write and read operations can be independently carried out, the non-volatile semiconductor memory device of the present invention can have a partition in which these functions can be carried out at the same time.

3. A Method for Holding Partition Division Information

Next, a method for holding partition division information in the partition latch circuit 18 is explained.

The partition latch circuit 18 is a latch circuit holding partition division information. The command analyzing and status data generating part 6 receives a control signal 2, data 3 and an address 4 from the outside and, when these are a command to write to the partition latch circuit 18, it writes partition division information to the partition latch circuit 18.

Then, the following sequence is shown as Example 1 of a command input row to write the partition division information to the partition latch circuit 18.

Commands are entered as follows:

1. Command to write Partition division information
2. Partition No.
3. Memory block No.
4. Memory block No.

wherein memory blocks to be included in a partition directed by Partition No. information in Item 2 are given as Memory block No. information in Items 3 or later. Here, memory blocks to be included in each partition may be directed arbitrarily.

Figure 4:
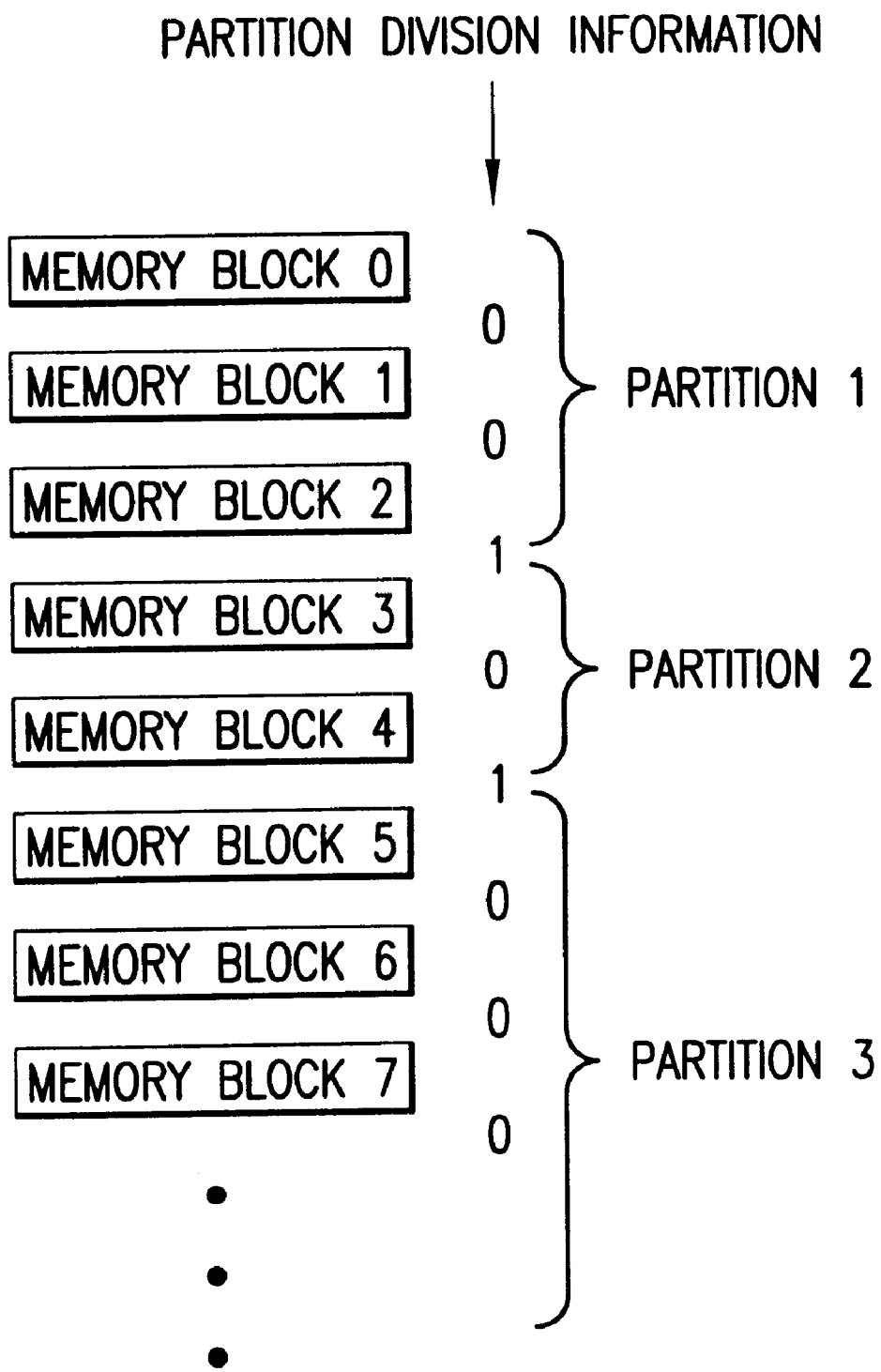
FIG. 4 illustrates a partition comprised of a plurality of memory blocks of the present invention. This figure exemplifies a command input to write partition division information.

Next, the following sequence is explained using FIG. 4 as Example 2 of a command input row to write the partition division information to the partition latch circuit 18.

Commands are entered as follows:

1. Command to write Partition division information
2. Partition division information.

The command to write partition division information may be carried out at one write operation by entering data 3 and partition division information in FIG. 1 by an address 4 in FIG. 1.

Partition division information is a flag designating the border between partitions comprised of consecutively numbered memory blocks.

When two adjoining memory blocks belong to the same partition, then, a number "0" is given to a boundary of these two memory blocks, and when two adjoining memory blocks belong to different partition each other, then, a number "1" is given to their boundary. That is, boundaries of memory blocks given the number "1" are border of partitions. In FIG. 4, since the partition division information is "00101000 . . . ", the partition 1 includes memory blocks 0, 1 and 2, the partition 2 includes memory blocks 3 and 4, and the partition 3 includes memory blocks 5, 6, 7, and etc.

This method, unlike Example 1 of the input row, can direct successive memory blocks to a partition, but it can lessen the commands to be entered and, further, avoid a risk to direct one memory block to different partitions overlappedly.

Next, an information holding-mean of the partition latch circuit 18 is explained.

In order to hold information, the partition latch circuit 18 may be either a latch circuit using a non-volatile memory or a latch circuit using a volatile memory.

In the case of a non-volatile circuit, a partition division state can be held after the power is shut down. On the other hand, in the case of a volatile circuit, since a rewrite speed is high, a temporary alteration of the partition division information is possible.

In addition, a non-volatile circuit and a volatile circuit may be used together. In this case, the non-volatile circuit holds the initial state of each of partitions at the time when the power is turned on, and the volatile circuit may be used to temporarily alter the partition division information.

4. Protection of Partition Division Information

Figure 5:
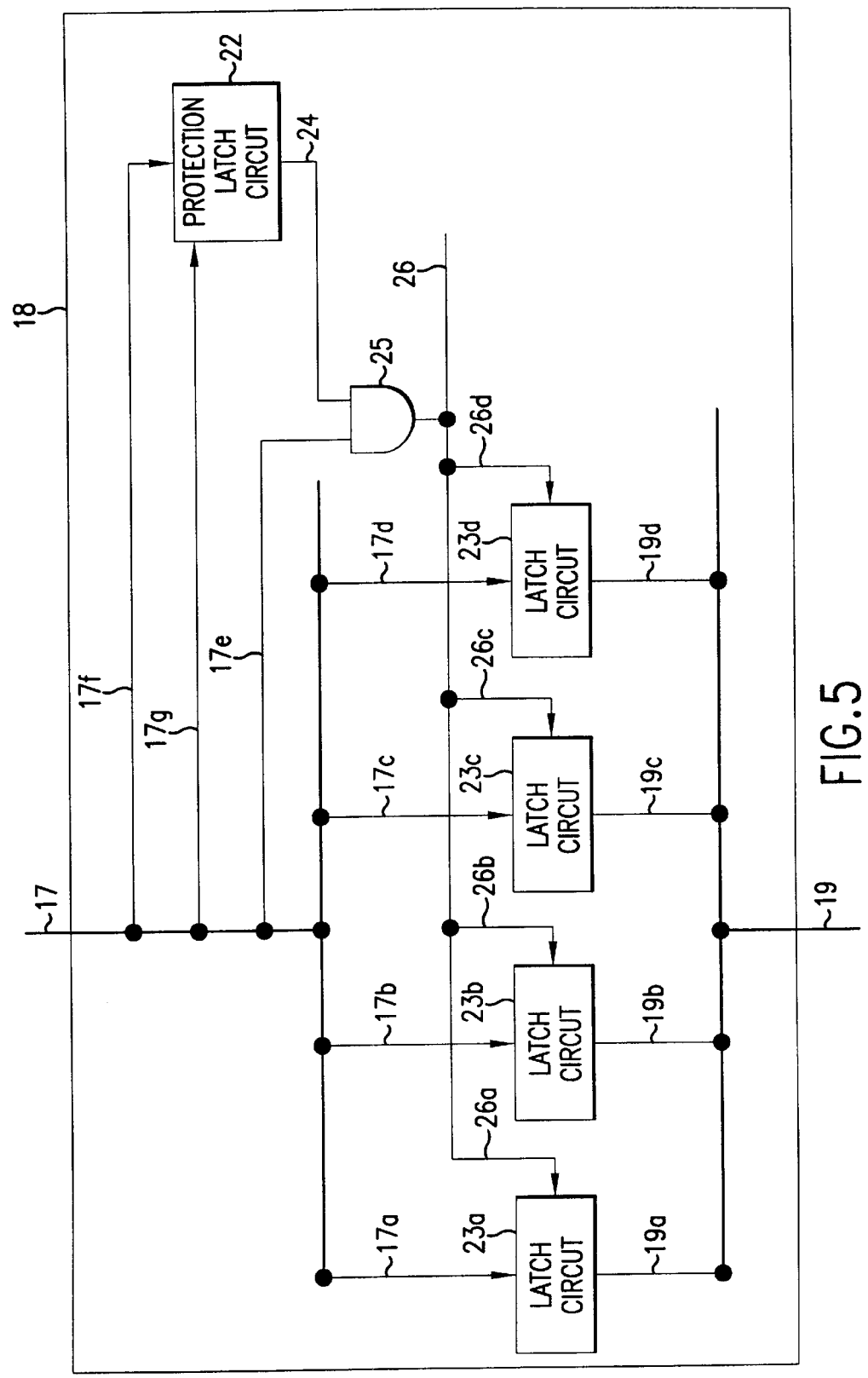
FIG. 5 is a block diagram showing a function for protecting partition division information in the present non-volatile semiconductor memory device.

Next, a function for protecting the partition division information is explained using FIG. 5. In FIG. 5, since the constituents indicated with the same symbols as those in FIG. 1 are the same as or equivalent to the constituents in FIG. 1, only different constituents from FIG. 1 are described below.

Bus 17 writes partition division information to the partition latch circuit 18 when the control signal 2, the data 3 and the address 4 are a command to write to the partition latch circuit 18. Here, partition division information 17a~17d, partition division information write control signal 17e, and partition division information protect signals 17f and 17g are sent via the bus 17.

The partition latch circuit 18 holds information to which partition each of the memory blocks belongs.

Buses 19 output the partition division information held in the latch circuit 18.

Latch circuits 23 (23a~23d) hold partition division information, and one latch circuit latches one piece of partition division information.

A protection latch circuit 22 holds information to protect writing to the latch circuits 23 (23a~23d).

An output signal 24 is outputted from the protection latch circuit 22.

A circuit 25 judges whether the partition division information write signal 17e is valid or invalid according to the output signal 24 which is the information to protect writing held in the latch circuit 22.

Control signals 26 are signals for rewriting the information of the latch circuits 23 (23a~23d) holding the partition division information to partition division information 17a~17d.

First, in order to protect partition division information, a latch circuit 22 for protecting partition division information is set in the partition latch circuit 18. Hereinafter, an output signal 24 from the latch circuit 22 for protecting this partition division information is referred to as a "partition division information protection flag 24". When partition division information is written as described above, by referring to the partition division information protection flag 24, when the protection of the partition division information is valid, the partition division information write control signal 26 becomes invalid and, consequently, the information in the latch circuits 23 (23a~23d) holding the partition division information is not rewritten. Therefore, the partition division information is protected.

A method for holding data of the partition division information protection flag is the same as the method for holding partition division information. That is, data of the partition division information protection flag are written in the latch circuit 22 for protecting the partition division information via the buses 17 (17f and 17g), when the control signal 2, the data 3 and the address 4 entered in the command analyzing and status data generating part 6 from the outside are a command to write to the latch circuit 22 for protecting the partition division information. Here, a write control signal 17f and a data signal 17g are transmitted to the latch circuit 22.

The latch circuit 23 holding the partition division information and the protection latch circuit 24 outputting the partition division information protection flag may be either a non-volatile circuit or a volatile circuit.

Figure 6:
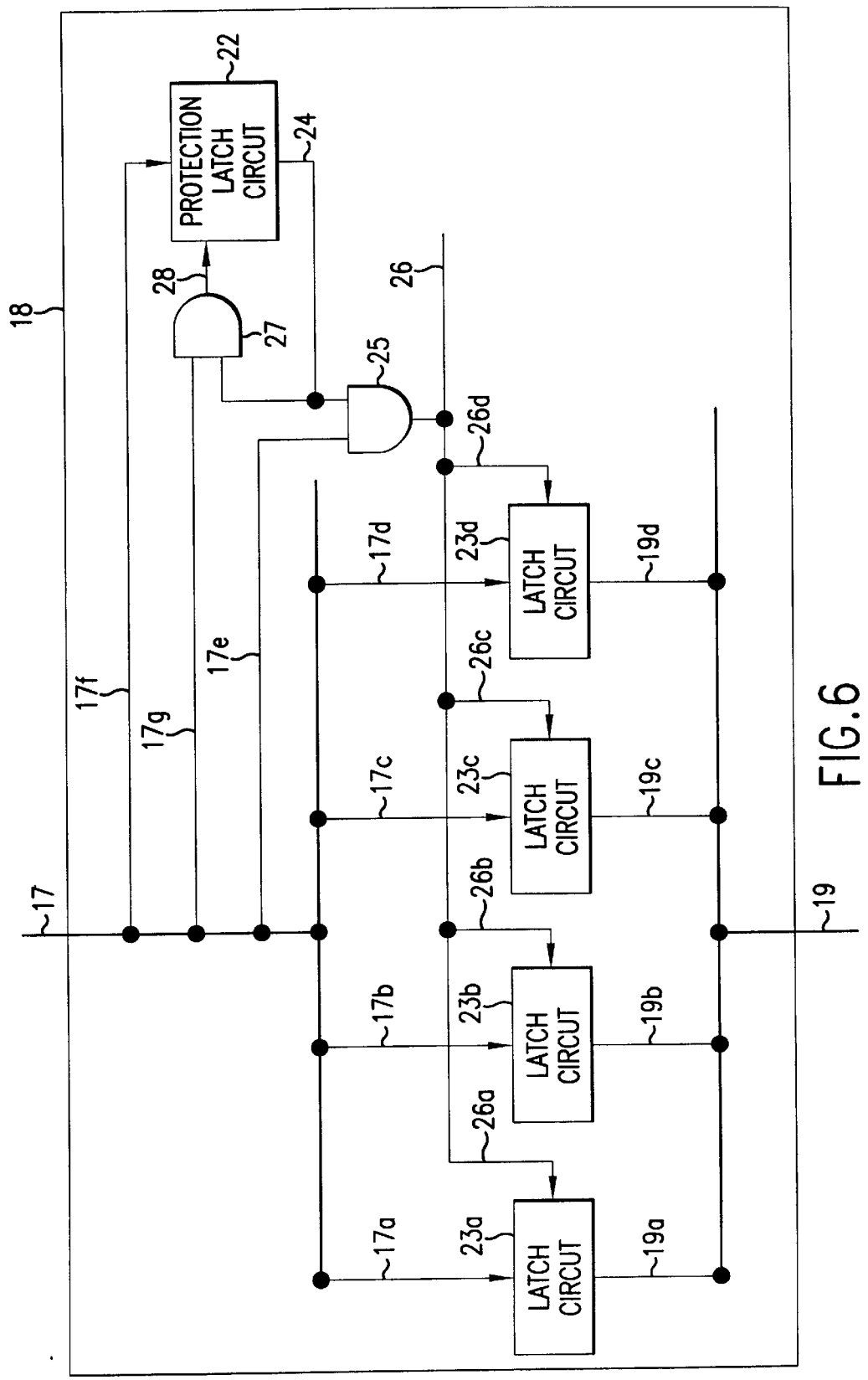
FIG. 6 is another block diagram showing a function for protecting partition division information in the present non-volatile semiconductor memory device.
Figure 7:
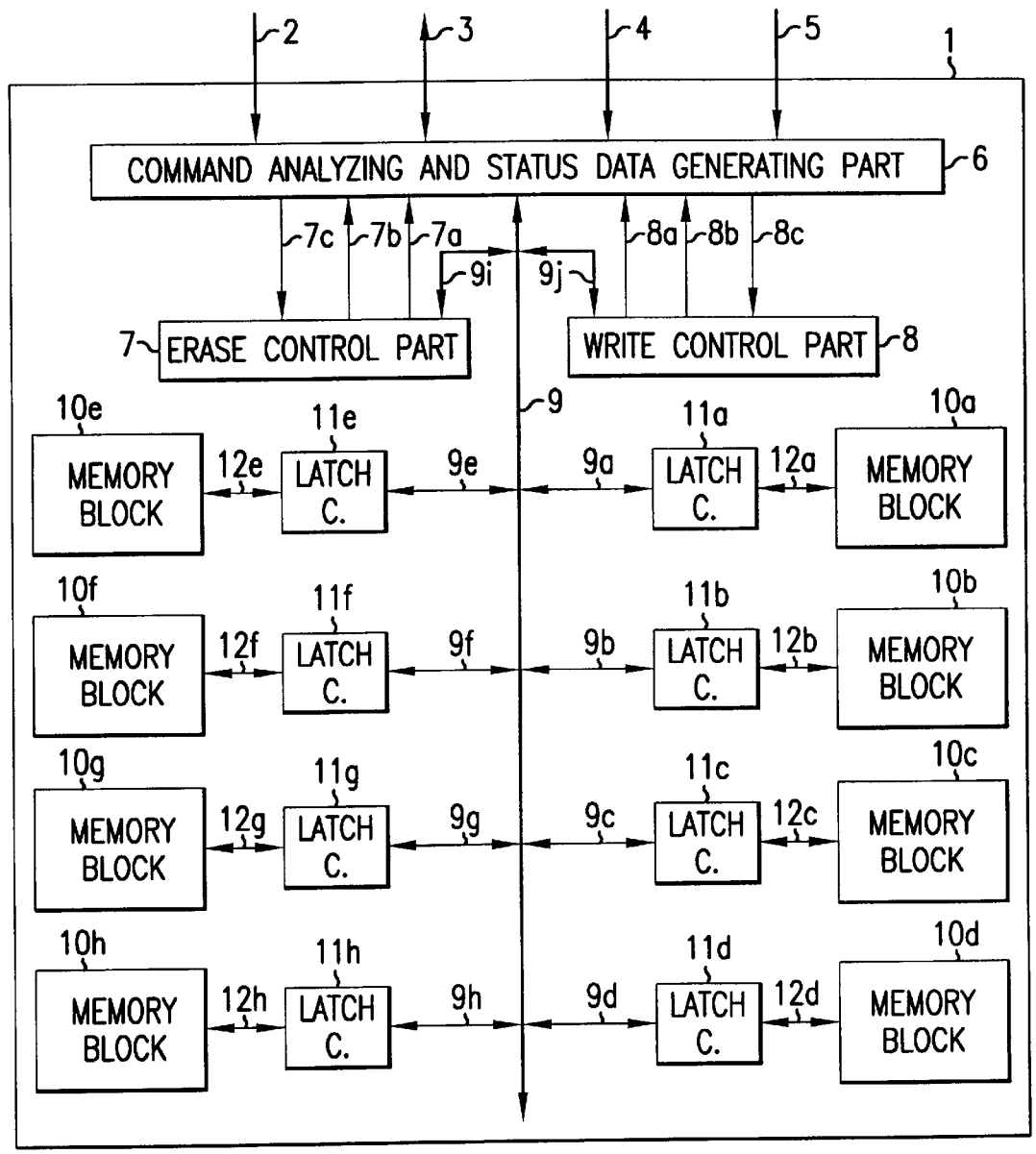
FIG. 7 is a block diagram showing an embodiment of a non-volatile semiconductor memory device of the prior art.
Figure 8:
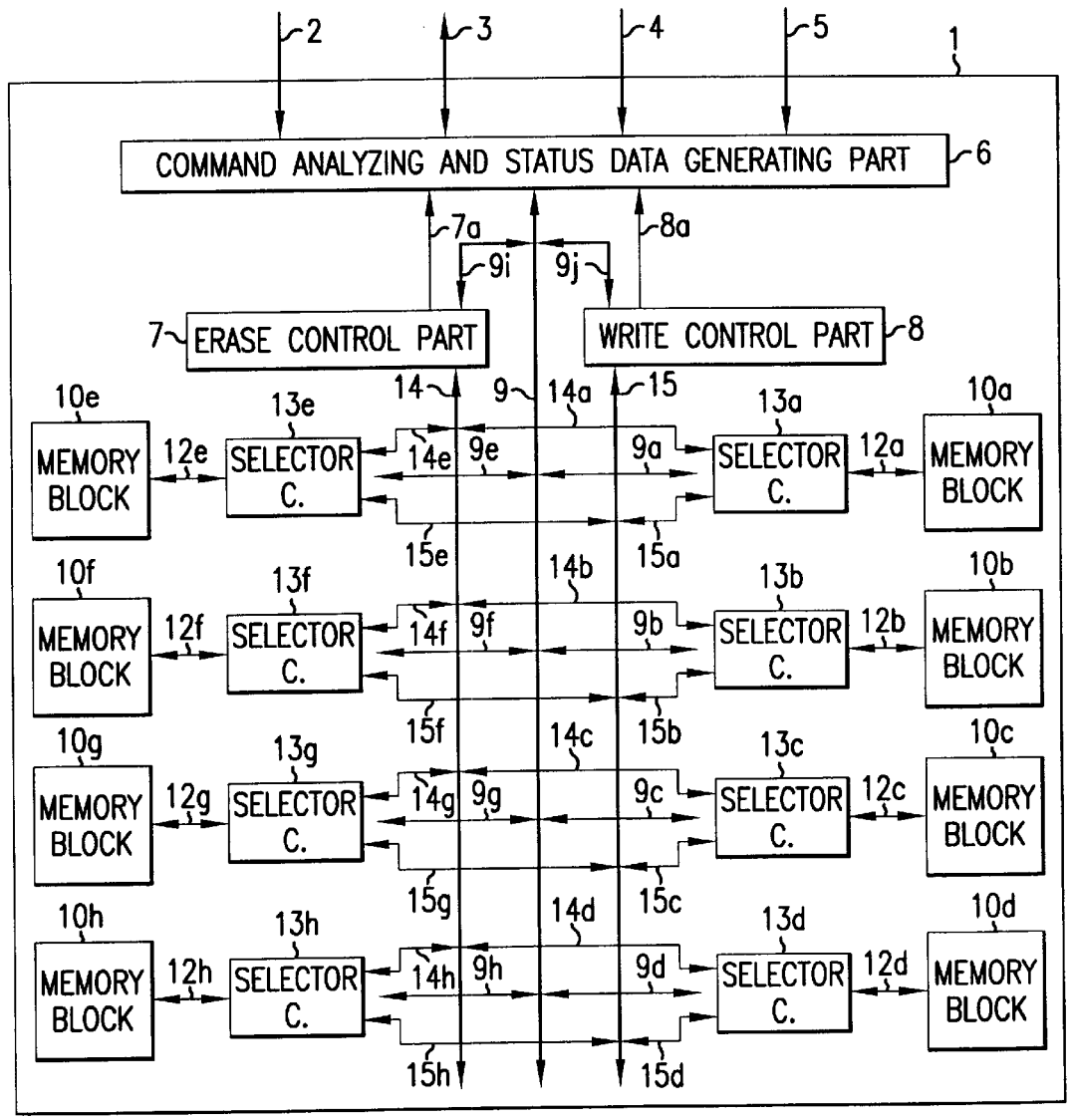
FIG. 8 is a block diagram showing another embodiment of a non-volatile semiconductor memory device of the prior art.

When the latch circuit 23 is comprised of a non-volatile circuit, as shown in FIG. 6, it is advantageous to add a circuit 27 judging whether the partition division information write control signal 17e is valid or invalid according to the output signal 24 which is the information to protect writing held in the latch circuit 22, and a partition division information write control signal 28. Thereby, when the partition division information protection flag 24 is valid, the partition division information write control signal 28 becomes invalid and, consequently, the information in the latch circuit 22 is not rewritten. That is, it becomes impossible to make the partition division information protection flag 24 invalid and, therefore, since the partition division information protection flag 24 keeps its validity, writing to the latch circuits 23 (23a~23d) keeps being protected. Thus, the partition division information can be fixed to disapprove in future the alteration of the information.

The number of memory blocks included in one partition is determined according to the partition division information in the partition latch circuit 18 and, since the partition division information can be altered by commands, the memory volume of a partition can be varied anytime. Therefore, it is possible to effectively distribute memory segments to be used.

Further, when according to the partition division information given by the command to write partition division information, only one partition is set in the non-volatile semiconductor memory device of the present invention (i.e., all the memory blocks of the non-volatile semiconductor memory device are included in a single partition), for example, during an erase operation, since all the latch circuits 11 hold information indicating on the erase operation, no memory block exists in which a write and read operations can be carried out simultaneously. Since the same thing can be said to a write operation, the above non-volatile semiconductor memory device is not able to carry out two or more functions of erasing, writing and reading. That is, since the above non-volatile semiconductor memory device is equivalent to a non-volatile semiconductor memory device of the prior art, which is not able to carry out two or more functions at the same time, compatibility in a test or usage of a non-volatile semiconductor memory device is maintained.

INDUSTRIAL APPLICABILITY

As explained in details above, a non-volatile semiconductor memory device of the present invention has a plurality of erasable, writable and readable memory segments, and can carry out erase, write and read functions simultaneously by altering a combination of these memory segments. Thus, distribution of memory segments to be used can be effectively performed according to the purpose of using by altering the memory segments where these functions can be carried out at the same time. That is, the present invention provides a non-volatile semiconductor memory device which can flexibly satisfy the diversifying market demand. In addition, since the alteration of the memory region distribution is possible by entering a command, the distribution of memory segments to be used can be effectively preformed anytime according to the purpose of use.

In addition, the use of a non-volatile memory or a volatile memory, or both a non-volatile memory and a volatile memory allows a method to save partition division information after the shut-down of the power, to alter it during the use, or to hold partition division information as an initial value at the time when the power is turned on.

The semiconductor memory device of the present invention has a protecting function of rewriting partition division information saved in latch circuits to fix the partition division information. Also, the non-volatile semiconductor memory device of the present invention, as described above, allows to distribute memory segments to be used according to the purpose of the use after the semiconductor has been produced and, at the same time, allows to prevent the distribution of the memory segments to be used from being undesirably altered with entry of an incorrect command by setting the protection information.

In the non-volatile semiconductor memory device of the present invention, its memory region comprises a number of erasable, writable and readable memory blocks in which these functions can be carried out simultaneously. According to the present non-volatile semiconductor memory device, since the memory region is controlled by a partition unit constituting a plurality of memory blocks, the number of objects to be controlled can be reduced relative to the case where the memory region is controlled as individual memory block units.

Thus, in a system using the present non-volatile semiconductor memory device, the control thereof can be simplified than in a conventional system.

In addition, form the viewpoint of products comprising the present non-volatile semiconductor memory device, for example, in the field of portable phones which is a large market of a non-volatile semiconductor memory device such as a flash memory, when internet applications such as a mailing-function which is greatly prevailing in recent years are added to a portable phone only for call, since a program region (a memory region for reading) can be expanded without modifying a design of the product, and the execution of the program (reading from the memory region for reading) can be carried out together with a write operation to a data region (a memory region for writing), a high-speed transaction is achieved.

What is claimed is:

1. A non-volatile semiconductor memory device having a memory region comprised of a plurality of memory segments which are electrically batch-erasable, writable, and readable, each of the plurality of memory segments being independently operable from each other, said non-volatile semiconductor memory device comprising:

memory-region-division-information holding means which holds a memory region division information for dividing the memory region into a plurality of memory segment groups comprising at least one memory segment; and memory-segment-group selecting means which generates a signal for selecting a memory segment group to all the memory segments belonging to the each of the memory segment groups according to the held memory-region-division-information holding means.

2. The non-volatile semiconductor memory device according to claim 1, wherein the memory region division information held in the memory-region-division-information holding means is fed by entering a command from the outside.

3. The non-volatile semiconductor memory device according to claim 1, wherein the memory segment group for which the memory-segment-group selecting means generates a selecting signal is directed by entering an address from the outside.

4. The non-volatile semiconductor memory device according to claim 1, wherein the memory segment comprises a memory block, a latch circuit holding an operation state of the memory block, and a selector circuit selecting any of signals required to erase, write and read and transmitting the selected signal to the memory block.

5. The non-volatile semiconductor memory device according to claim 4, wherein the selector circuit selecting any of the signals required to erase, write and read is controlled by the selecting signal from the memory-segment-group selecting means or an operation state of the memory block which is held in the latch circuit.

6. The non-volatile semiconductor memory device according to claim 1, wherein a circuit holding information in the memory-region-division-information holding means comprises a non-volatile memory.

7. The non-volatile semiconductor memory device according to claim 6, wherein the memory-region-division-information holding means has protection-information holding means which holds information for protecting the memory region division information and means for prohibiting alteration of the memory region division information according to the held protection information.

8. The non-volatile semiconductor memory device according to claim 7, wherein information for protecting the memory region division information is given to the protection-information holding means by entering a command from the outside.

9. The non-volatile semiconductor memory device according to claim 8, which further comprises means for invalidating the command entry into the protection-information holding means.

10. The non-volatile semiconductor memory device according to claim 1, wherein a circuit holding information in the memory-region-division-information holding means comprises a volatile memory.

11. The non-volatile semiconductor memory device according to claim 1, wherein a circuit holding information in the memory-region-division-information holding means comprises both a non-volatile memory and a volatile memory.

* * * * *